United States Patent
Koike

(10) Patent No.: US 6,541,285 B2
(45) Date of Patent: Apr. 1, 2003

(54) METHOD OF ESTIMATING LIFETIME OF SEMICONDUCTOR DEVICE, AND METHOD OF RELIABILITY SIMULATION

(75) Inventor: Norio Koike, Kyoto (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/878,839

(22) Filed: Jun. 11, 2001

(65) Prior Publication Data

US 2002/0008252 A1 Jan. 24, 2002

(30) Foreign Application Priority Data

Jun. 27, 2000 (JP) ........................................ 2000-192946

(51) Int. Cl.$^7$ .......................... G01R 31/26; H01L 21/66
(52) U.S. Cl. ............................. 438/14; 438/17; 324/769
(58) Field of Search .................. 702/117; 324/769, 324/765; 438/14, 17; 328/769

(56) References Cited

U.S. PATENT DOCUMENTS

| | | | |
|---|---|---|---|
| 5,508,632 A | | 4/1996 | Shimizu et al. ............. 324/769 |
| 5,615,377 A | | 3/1997 | Shimizu et al. ............. 395/500 |
| 5,999,011 A | * | 12/1999 | Chu et al. .................... 324/769 |
| 6,047,247 A | * | 4/2000 | Iwanishi et al. ............. 324/769 |
| 6,173,235 B1 | * | 1/2001 | Maeda ......................... 324/769 |
| 6,198,301 B1 | * | 3/2001 | Chetlur et al. .............. 324/765 |

FOREIGN PATENT DOCUMENTS

| | | |
|---|---|---|
| JP | 7-99302 | 4/1995 |
| JP | 8-64814 | 3/1996 |

OTHER PUBLICATIONS

"An Empirical Model for Device Degradation Due to Hot–Carrier Injection", IEEE Electron device letters, pp. 111–113, Apr. 1983; E. Takeda et al.

"Berkeley Reliability Tools–BERT", IEEE Transactions on computer–aided design of integrated circuits and systems, vol. 12, No. 10, pp. 1524–1534, Oct. 1993; Robert H. Tu et al.

"Simulation of MOSFET Lifetime under AC Hot–Electron Stress", IEEE Transactions on electron devices, vol. 35, No. 7, pp. 1004–1011, Jul. 1988; Mary M. Kuo et al.

"A Bi–directional NMOSFET Current Reduction Model for Simulation of Hot–Carrier–Induced Circuit Degradation", IEEE Transactions on electron devices, vol. 40, No. 12, pp 2245–2254, Dec. 1993; K.N. Quader et al.

"A Simple Method to Characterize Substrate Current in MOSFET's", IEEE Electron device letters, vol. EDL–5, No. 12, pp. 505–507, Dec. 1984; T.Y. Chan et al.

"BSIM: Berkeley Short–Channel IGFET Model for MOS Transistors", IEEE Journal of solid–state circuits, vol. SC–22, No. 4, pp. 558–566, AUg. 1987, B.J. Sheu et al.

"Hot–Electron–Induced MOSFET Degradation–Model, Monitor, and Improvement", IEEE Transactions on electron devices, vol. ED–32, No. 2, pp. 375–385, Feb. 1985; Chenming Hu et al.

* cited by examiner

*Primary Examiner*—Hoai Ho
*Assistant Examiner*—Tutu Ho
(74) *Attorney, Agent, or Firm*—Merchant & Gould P.C.

(57) ABSTRACT

A hot carrier lifetime of a MOS transistor is estimated depending on a hot carrier lifetime model expressed as $t \cdot I_{sub}^{-m} \cdot I_d^{m-2}$ where t is a lifetime, $I_{sub}$ is a substrate current, $I_d$ is a drain current, and m is a fitting parameter. When hot carrier degradation of the MOS transistor is simulated, a parameter Age representing cumulative stress quantity with respect to the MOS transistor is calculated by a model formula expressed as Age $\int [I_{sub}^m \cdot I_d^{2-m}]dt$ where t is time. As a result, a lifetime under a condition to cause maximum hot carrier degradation is estimated accurately, and a lifetime in actual use can be estimated accurately. Moreover, a hot carrier lifetime parameter can be calculated in a short time with small numbers of transistors.

12 Claims, 6 Drawing Sheets

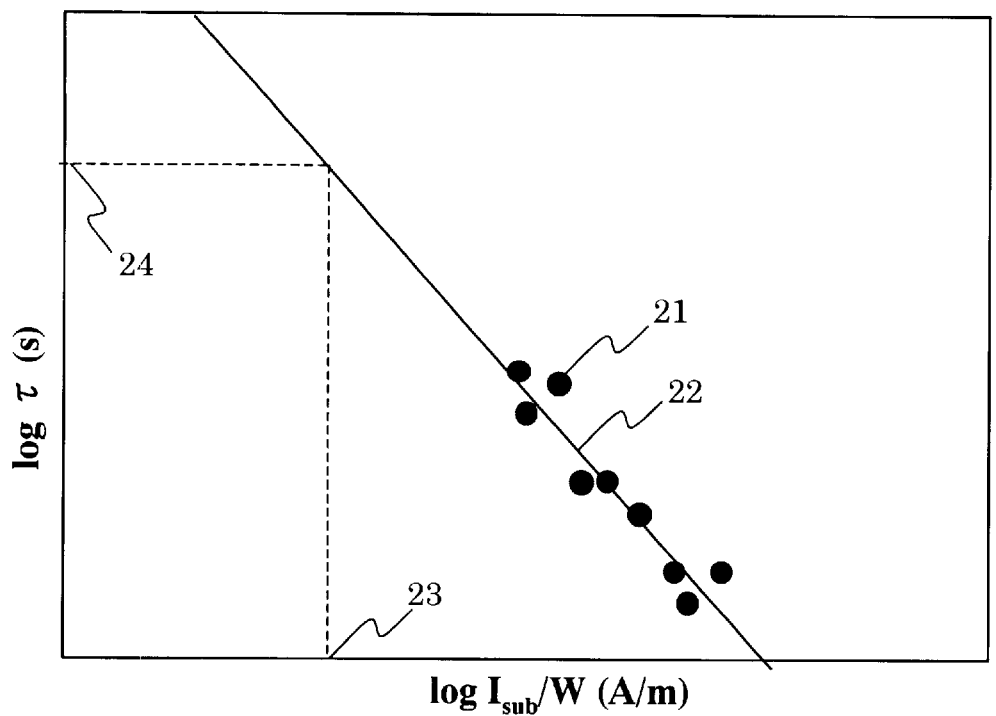
FIG.6
(PRIOR ART)
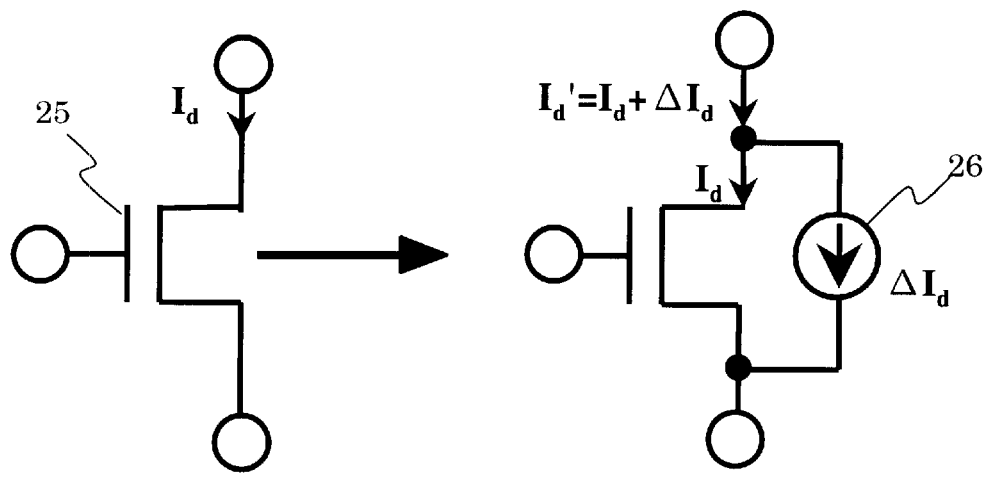
FIG.7A
(PRIOR ART)
FIG.7B
(PRIOR ART)

METHOD OF ESTIMATING LIFETIME OF SEMICONDUCTOR DEVICE, AND METHOD OF RELIABILITY SIMULATION

FIELD OF THE INVENTION

The present invention relates to a method of estimating a lifetime concerning hot carrier degradation of a MOS transistor, more specifically, it relates to improvement of accuracy in lifetime estimation. The present invention relates to also a method of simulating circuit characteristic degradation caused by hot carrier degradation of a MOS transistor, more specifically, it relates to improvement of simulation accuracy.

BACKGROUND OF THE INVENTION

The size of MOS transistors has been reduced considerably with a trend toward high density, high integration and miniaturization of semiconductor integrated circuit devices. With the miniaturization trend, especially due to the decreasing channel length, hot carrier degradation has been a critical problem, since the degradation will affect the reliability of a MOS transistor. Hot carrier degradation refers to a phenomenon that highly energized electrons and positive holes (hereinafter 'hot carrier') are generated by a high electric field at a drain end of a MOS transistor, which will degrade the characteristics of a gate oxide film. This hot carrier degradation includes plural degradation modes. When the degradation relates to a condition to cause a maximum substrate current, a drain current is decreased over time for any of N-type or P-type MOS transistor. As a result, the delay time of the circuit is increased over time. When the delay reaches a certain degree, a timing error occurs at a time of input/output of signals in the interior of the semiconductor integral circuit or between the circuit and outside, and this causes malfunction of an entire system in which the semiconductor integrated circuit is assembled.

Regarding the hot carrier degradation, hot carrier reliability has been evaluated by a stress acceleration experiment under a DC condition with respect to the MOS transistor. And product reliability has been provided by optimizing a production process to satisfy the hot carrier evaluation standard.

A hot carrier lifetime model used in such a hot carrier reliability evaluation is as follows. Hot carrier degradation of a MOS transistor is evaluated by, for example, $\Delta I_d/I_d$, and this is a ratio of a drain current variation $\Delta I_d$ to an initial drain current $I_d$. Under a static hot carrier stress condition by a DC (direct current), the hot carrier degradation rate $\Delta I_d/I_d$ is represented by the following formula (1).

$$\Delta I_d/I_d = A \cdot t^n \qquad (1)$$

Here, t denotes a hot carrier stress time, while characters 'A' and 'n' are regarded as coefficients depending on a transistor manufacturing process and a stress condition.

If a transistor lifetime τ is defined as a stress time required for a variation rate of drain current to reach $(\Delta I_d/I_d)_f$, a formula (2) is obtained from the formula (1). For example, time t when $(\Delta I_d/I_d)_f = 10\%$ is defined as a lifetime τ.

$$(\Delta I_d/I_d)_f = A \cdot \tau^n \qquad (2)$$

In a typical stress acceleration experiment for a MOS transistor, DC stress is applied to a transistor so that the transistor lifetime reaches a variation rate $(\Delta I_d/I_d)_f$ defined by the formula (2) within a measureable time period, that is, from 1 second to about 100,000 seconds. Then, a drain current of the transistor is measured to calculate a transistor lifetime from $\Delta I_d/I_d$ in a linear region or a saturation region.

The following stress voltage application method is used in a stress acceleration experiment during a hot carrier reliability evaluation. Every gate voltage $V_g$ is determined at a condition where the hot carrier degradation rate is maximized with respect to each of plural drain voltages $V_d$ used for the acceleration experiment. In other words, each of the gate voltages $V_g$ causes a maximum substrate current $I_{sub}$ under a respective drain current. At this time, one gate voltage is set for each drain voltage. In this way, a transistor lifetime is calculated under a condition that the degradation rate is maximized with respect to an arbitrary drain voltage.

A method of evaluating hot carrier reliability of a MOS transistor is described in IEEE Electron Device Lett., vol. 4, pp. 111–113, April 1983 by E. Tanaka et al. According to the description, the lifetime τ of a MOS transistor is calculated by using an empirical model represented by the following formula (3).

$$\tau \propto (I_{sub}/W)^{-m} \qquad (3)$$

In this formula, W denotes a gate width and $I_{sub}$ denotes a substrate current.

FIG. 6 shows a method of estimating a lifetime based on this empirical model. In FIG. 6, each black dot 21 denotes a measured value of the lifetime, and a line 22 denotes a regression line of lifetime estimation. Numeral 23 denotes a maximum substrate current value for a unit gate width in actual use, and 24 denotes an estimated lifetime in actual use. For a lifetime estimation, a logarithm of $I_{sub}/W$ is used to enter a horizontal axis of a graph, and a logarithm of T is used to enter the vertical axis so that the measured values 21 for a lifetime are plotted. Next, the regression line 22 is fitted to the measured values 21 by using a least squares method. The maximum substrate current 23 for a unit gate width in actual use is also measured separately. The preliminary fitted regression line 22 is used to obtain a lifetime 24 corresponding to the maximum substrate current 23 in actual use, and this is determined as an estimated lifetime in actual use. Hot carrier reliability evaluation is executed by observing whether the lifetime 24 satisfies a hot carrier evaluation standard, e.g., whether the lifetime 24 satisfies a standard of at least 10 years.

Recently however, such a conventional hot carrier evaluation standard has been difficult to satisfy in the hot carrier reliability evaluation under the DC condition. For solving this problem, a recently developed technique provides product reliability by a simulation of hot carrier degradation for a semiconductor integrated circuit (hereinafter "circuit reliability simulation"). A circuit reliability simulator simulates a circuit operation subsequent to hot carrier degradation by using a hot carrier lifetime model and a SPICE parameter after degradation, and the simulation is based on calculated values of voltage and current at every terminal of every transistor which are calculated by a circuit simulator SPICE. Typical simulators are BERT developed at the University of California, Berkeley (R. H. Tu et al., "Berkeley reliability tools-BERT," IEEE Trans. Compt.-Aided Des. Integrated Circuits & Syst., vol.12, no.10, pp.1524–1534, October 1993), and BTABERT (a commercial version of BERT). This circuit reliability simulation technique is used for estimating degraded or malfunctioning parts in a semiconductor integrated circuit and measures against the degradation or malfunction are taken during designing, so that reliability assurance or reliability design is possible.

An example of simulation methods concerning hot carrier degradation of a MOS transistor is described in IEEE Trans. Electron Devices, vol.35, pp.1004–1011, July 1988 by Kuo et al. A hot carrier lifetime model applied to this circuit reliability simulator is as follows. According to Kuo et al., a lifetime τ of a MOS transistor is represented by an empirical formula (4) using a hot carrier lifetime model.

$$\tau = ((\Delta I_d/I_d)_f)^{1/n} \cdot H \cdot W \cdot I_{sub}^{-m} \cdot I_d^{m-1} \quad (4)$$

In the formula, W denotes a gate width, H denotes a coefficient depending on a condition for manufacturing a transistor, $I_{sub}$ denotes a substrate current, and m denotes an index relating to an impact ionization and interface level formation.

A coefficient A in a hot carrier lifetime model is represented by a formula (5) that is derived from the formulas (2) and (4).

$$A = ((W \cdot H)^{-1} \cdot I_{sub}^{m} \cdot I_d^{1-m})^n \quad (5)$$

Therefore, a formula (6) is derived from the formulas (1) and (5).

$$\Delta I_d/I_d = ((W \cdot H)^{-1} \cdot I_{sub}^{m} \cdot I_d^{1-m} \cdot t)^n \quad (6)$$

When Age is defined for convenience as in the following formula (7), the formula (6) can be rewritten into a formula (8).

$$\text{Age} = (W \cdot H)^{-1} \cdot I_{sub}^{m} \cdot I_d^{1-m} \cdot t \quad (7)$$

$$\Delta I_d/I_d = (\text{Age})^n \quad (8)$$

In the formula (7), 'Age' represents a stress quantity from a start of hot carrier stress to a time t in a hot carrier lifetime model. For a physical aspect of view, it represents a total quantity of hot carrier having energy of at least a critical energy to generate damage in a MOS transistor.

The parameters n, H and m used in the formulas (4)-(8) are regarded as hot carrier lifetime parameters. These hot carrier lifetime parameters are functions of vertical electric field strength at a drain end where the hot carrier is generated. Therefore, these parameters are represented as functions of a gate-drain voltage $V_{gd}$.

FIGS. 7A and 7B show a method of simulating characteristics after degradation by using a $\Delta I_d$ model. A simulation method using a $\Delta I_d$ model is described in IEEE Trans. Electron Devices, vol. 40, pp.2245–2254, December 1993 by Quader et al.

FIGS. 7A and 7B are equivalent circuit diagrams showing a method of simulating hot carrier degradation of a MOS transistor. In FIGS. 7A and 7B, 25 denotes a fresh MOS transistor before stress application, and 26 denotes a variable current source. FIG. 7A shows a drain current $I_d$ flowing in a fresh MOS transistor before stress application. FIG. 7B shows a drain current $I_d'$ flowing in a MOS transistor after hot carrier degradation. It is shown that the drain current flowing in the transistor changes from the initial drain current $I_d$ by $\Delta I_d$.

As shown in the following formula (9), a drain current $I_d'$ after degradation is simulated by adding degradation $\Delta I_d$ of a drain current to a fresh drain current $I_d$ before stress application.

$$I_d' = I_d(V_d, V_g) + \Delta I_d(\text{Age}, V_d, V_g) \quad (9)$$

$\Delta I_d$ is a function of Age as stress quantity from the start of hot carrier stress to a time t, as well as a function of a drain voltage $V_d$ and a gate voltage $V_g$. For calculating Age under a dynamic stress condition by AC (alternating current) in a circuit, the formula (7) is rewritten into the following formula (10) as an integral form about time for calculation.

$$\text{Age} = \int [(W \cdot H)^{-1} \cdot I_{sub}^{m} \cdot I_d^{1-m}] dt \quad (10)$$

In this simulation, $\Delta I_d$ is represented by an equivalent circuit prepared by adding a variable current source 26 shown in FIG. 7B to a source-drain of an initial MOS transistor. At this time, a transistor parameter to calculate the initial drain current is not changed.

FIG. 8 is a flow chart to show a process to simulate hot carrier degradation of a MOS transistor according to a conventional technique. In this flow chart, a step S1 includes sub-steps S1a-S1g to extract an unknown parameter in the formulas (9) and (10) with respect to a hot carrier lifetime model by a preliminary measuring experiment.

In the sub-step S1a, a model formula $I_{sub} = g(V_g, V_d)$ is determined to fit to measurement data of plural substrate currents $I_{sub}$ in a preliminary measuring experiment, so that the substrate current $I_{sub}$ in the formula (10) is determined. Here, $V_g$ denotes a gate voltage, and $V_d$ denotes a drain voltage. An example of a method for determining a substrate current $I_{sub}$ is described in IEEE Electron Device Lett., vol. EDL-5, pp.505–507, December 1984 by Chan et al.

The sub-steps S1b-S1d' are for extracting hot carrier lifetime parameters in a preliminary measuring experiment. In the sub-step S1b, a stress voltage is applied to a MOS transistor, and a hot carrier lifetime defined by the formula (2) is measured. For applying the stress voltage, a gate voltage $V_g$ is set so that a gate-drain voltage $V_{gd} = V_g - V_d$ is constant with respect to plural drain voltages $V_d$. In this method, typically plural numbers of $V_{gd}$ are set, and also gate voltages $V_g = V_d + V_{gd}$ corresponding to the plural $V_{gd}$ are set with respect to every drain voltage $V_d$. In the following sub-step S1c', coefficient n is extracted as a function of $V_{gd}$ by a comparison between the empirical formula (1) and data concerning measurement points in a DC stress experiment for the sub-step S1b. Similarly in the sub-step S1d', an index m and a coefficient H are extracted as functions of $V_{gd}$ by a comparison between the empirical formula (4) and data concerning measuring points in a DC stress experiment for the sub-step S1b.

Sub-steps S1e-S1g are for determining a fresh drain current $I_d$ before stress application and degradation $\Delta I_d$ of the drain current in the formula (9) for a $\Delta I_d$ model. In the sub-step S1e, transistor parameters such as carrier mobility and a flat-band voltage are extracted. Such parameters are used for determining fresh drain current $I_d(V_d, V_g)$ before stress application. BSIM (Berkeley Short-Channel IGFET Model) is used for a model to determine such a fresh drain current $I_d(V_d, V_g)$. The BSIM is described in detail in IEEE J. Solid-State Circuits, vol.SC-22, pp.558–566, August 1987 by Sheu et al. Subsequently in the sub-step S1f DC stress is applied to the transistor. In the sub-step S1g, $\Delta I_d$ model parameters are extracted before and after the DC stress application. The drain current degradation $\Delta I_d(\text{Age}, V_d, V_g)$ is determined by the $\Delta I_d$ model parameters. The $\Delta I_d$ model is described by Quader et al. in relation to NMOS. PMOS is described in JP-A-08-64814.

The transistor parameters should be extracted before DC stress application so that actual transistor characteristics before the stress application coincide with simulated transistor characteristics. The $\Delta I_d$ model parameters should be extracted before and after the DC stress application so that the actual drain current degradation $\Delta I_d$ before and after the stress application coincides with the simulated drain current degradation $\Delta I_d$.

The step S2 includes sub-steps S2a-S2d so that a reliability simulator simulates hot carrier degradation of a transistor in accordance with parameters extracted in the step S1 and also with the formulas (9) and (10).

In the sub-step S2a, a drain current is simulated by transistor parameters before stress application, where the parameters have been extracted in the prior sub-step S1e. In the sub-step S2b, a substrate current is simulated on the basis of a substrate current model formula $I_{sub}=g(V_g, V_d)$ determined by the S1a. In the sub-step S2c', Age, which represents degradation of each transistor based on the formula (10), is calculated by time-integrating functions of a drain current $I_d$ and a substrate current $I_{sub}$ in a circuit. At this time, the drain current $I_d$ simulated in the sub-step S2a, the substrate current $I_{sub}$ simulated in the sub-step S2b, and hot carrier lifetime parameters H and m calculated in the sub-step S1d', are used. In the sub-step S2d, hot carrier degradation of the transistor is simulated by using the formula (9) on the basis of the Age.

The following is a detailed explanation of a method of extracting hot carrier lifetime parameters H and m for a hot carrier lifetime model. FIG. 9 is an explanatory view of a method of extracting hot carrier lifetime parameters H and m. FIG. 9 relates to a plot for calculating hot carrier lifetime parameters H and m included in the empirical formula (4) using a hot carrier lifetime model. In FIG. 9, the vertical axis is a logarithmic scale of a value $\tau \cdot I_d/W$ calculated from a lifetime $\tau$ in a DC stress experiment, a drain current $I_d$ during a stress and a gate width W of a MOS transistor. The horizontal axis is a logarithmic scale of a ratio $I_{sub}/I_d$ when $I_{sub}$ is a substrate current during a stress and $I_d$ is a drain current. Numeral 27 denotes data concerning a plurality of measurement points in a DC stress experiment, and 28 denotes a line fitted with respect to data concerning the measurement points. The MOS transistor lifetime $\tau$ is measured under plural gate-drain voltage $V_{gd}$ conditions, e.g., under three conditions of $V_{gd}$=0.0, −1.0, and −2.0V, so that data 27 for plural measurement points are obtained. In this manner, a line 28, fitted by a least squares method with respect to data 27 concerning the measurement points, is obtained. Hot carrier parameters H and m are obtained respectively from an intercept and a gradient of the line 28. By executing this method for plural $V_{gd}$, the hot carrier lifetime parameters H and m in a hot carrier lifetime model can be calculated as functions of $V_{gd}$.

The above description is about a conventional method of estimating lifetime of hot carrier degradation of a MOS transistor, and a conventional method of simulating degradation in circuit characteristics caused by the hot carrier degradation. However, these methods can cause the following problems.

First, a lifetime under a condition for causing a maximum hot carrier degradation rate can be estimated to be longer than an actual lifetime in a method of estimating a lifetime of the hot carrier degradation of a MOS transistor. In such a method, it is hypothesized that a gate voltage causing maximum hot carrier degradation coincides with a gate voltage causing a maximum substrate current. In an empirical model (3), degradation is maximized as well at a gate voltage causing a maximum substrate current. Actually however, some processes for manufacturing transistors have maximum degradation at a gate voltage lower than a gate voltage causing a maximum substrate current. Therefore, lifetime in actual use can be shortened depending on a condition to use the MOS transistor as opposed to a lifetime corresponding to the maximum substrate current estimated according to this model. This results in a problem that the quality assurance of the product cannot be provided properly.

Concerning a method of simulating circuit characteristic degradation caused by the hot carrier degradation, numbers of transistors are required to calculate hot carrier lifetime parameters, and this method will take a long period of time. A DC stress experiment should be executed by setting plural gate voltages $V_g$ in order to keep a gate-drain voltage $V_{gd}=V_g-V_d$ to be constant with respect to plural drain voltages $V_d$, so that the index m and the coefficient H in the empirical formula (4) representing a conventional hot carrier lifetime model are extracted as functions of $V_{gd}$. In this case, total numbers of stress voltage conditions are increased considerably. For example, about three conditions for a drain voltage, and about five conditions for a gate-drain voltage are required, which results in about 15 stress voltage conditions. Moreover, since the results of the DC stress experiment vary, plural (e.g., about three) transistors are required for every voltage condition in order to obtain sufficiently accurate results. As a result, about 45 transistors will be required. In addition to that, these transistors should be produced under an identical process condition. Since prototypes are produced repeatedly while altering the process condition during a process development, it is difficult to prepare such large numbers of transistors under an identical process condition. Moreover, measurement of 45 transistors under 15 voltage conditions will take about 10 days with ordinary equipment and staff. As a result, it is difficult to provide prompt feedback to the product designing. Since the product is designed in parallel with the process development, substantially an actual process development has not carried out a step of extracting a hot carrier lifetime parameter to simulate reliability in order to realize product reliability at the time of designing. As a result, a standard of process reliability evaluation with an excessive reliability margin is applied for quality assurance. It is difficult to meet such a reliability evaluation standard while providing high transistor performance.

The cause of requiring numbers of transistors and long period of time for an experiment to calculate a hot carrier lifetime parameter is that a conventional hot carrier lifetime model represented with the formula (4) is insufficient for the purpose. Such a conventional hot carrier lifetime model is based on a hypothesis that hot carrier degradation is caused by a hot carrier of either a positive hole or an electron having energy of at least a critical energy required for generating damage to a MOS transistor, and that a hot carrier lifetime is inversely proportional to a yield of the one hot carrier. In this model, no functional forms are provided with respect to dependence of a gate-drain voltage $V_{gd}$ of the hot carrier lifetime parameters H and m. Therefore, a DC stress experiment should be performed by setting plural gate voltages $V_g$ with respect to plural drain voltages $V_d$ in order to measure the $V_{gd}$ dependence of the parameters H and m.

SUMMARY OF THE INVENTION

In order to solve the above-identified problems, the present invention provides a method of estimating lifetime of hot carrier degradation of a MOS transistor, so that the lifetime is estimated with accuracy under a condition for causing a maximum hot carrier degradation rate, and thus, the present invention provides proper quality assurance for a product.

The present invention enables calculating a hot carrier lifetime parameter in a short time by using a small number of transistors in a method of simulating circuit characteristic degradation caused by hot carrier degradation in order to provide product reliability at a time of designing, and to provide high transistor performance.

For the above-mentioned purposes, a method of estimating a lifetime of a semiconductor device according to the present invention is characterized in that a hot carrier lifetime is estimated depending on a hot carrier lifetime model:

$$\tau \, I_{sub}^{-m} \cdot I_d^{m-2}$$

where $\tau$ is a lifetime, $I_{sub}$ is a substrate current, $I_d$ is a drain current, and m is a fitting parameter.

The above-described hot carrier lifetime model according to the present invention reflects the fact that hot carrier degradation occurs due to two kinds of hot carriers of an electron and a positive hole having an energy of at least a critical energy required for generating damage to a MOS transistor, and that the hot carrier lifetime is inversely proportional to a product of a yield of these two hot carriers. According to this model, a model formula representing a hot carrier lifetime takes not either the conventional formulas (3) or (4) but the following formula (11).

$$\tau = ((\Delta I_d / I_d)_f)^{1/n} \cdot H \cdot W^2 \cdot I_{sub}^{-m} \cdot I_d^{m-2} \quad (11)$$

The model formula (11) is distinguished from the conventional model formula (4) in that the formula (11) adopts a functional form of (exponent of $I_d$)=−(exponent of $I_{sub}$)−2, while the conventional formula adopts (exponent of $I_d$)=−(exponent of $I_{sub}$)−1. The difference is caused by the fact that a hot carrier lifetime is inversely proportional to a yield of one kind of hot carrier in a conventional technique, while the same lifetime is inversely proportional to a yield of two kinds of hot carriers in the present invention.

It was confirmed by a comparison with measured values of N-type and P-type MOS transistors that a model of the present invention corresponds well to a measured value, and $V_{gd}$ dependence of the hot carrier lifetime parameters H and m is decreased considerably. The reason is considered to be that the model of the present invention reflects accurately a mechanism of hot carrier degradation of a MOS transistor. In a conventional model, $V_{gd}$ dependence of the hot carrier lifetime parameters H and m is increased. The reason is considered to be that such a model failed to reflect accurately a mechanism of hot carrier degradation of a MOS transistor.

In the above-mentioned method of estimating a lifetime of a semiconductor device, a minimum value of a hot carrier lifetime in actual use can be estimated from a substrate current and a drain current under a use condition. More specifically, the method of estimating lifetime of hot carrier degradation according to the present invention is executed in the following manner. First, the hot carrier lifetime parameters H and m in the formula (11) are calculated as constants based on measured values in a stress acceleration experiment. These parameters and formula (11) are used for obtaining a condition for causing maximum hot carrier degradation in actual use based on measured values of a substrate current $I_{sub}$ and a drain current $I_d$ in actual use, and a hot carrier lifetime at that time also is obtained. Thus obtained lifetime is applied as an estimated lifetime in actual use.

A method of simulating the reliability of a semiconductor device according to the present invention is characterized in that a parameter Age representing cumulative stress quantity relating to a MOS transistor is calculated on the basis of the following formula for simulating hot carrier degradation of the MOS transistor:

$$\text{Age} \int [I_{sub}^{m} \cdot I_d^{2-m}] dt$$

where t is time, $I_{sub}$ is a substrate current, $I_d$ is a drain current, and m is a fitting parameter.

For example, calculation is performed by using the following formula (12) as a functional form for time in place of the formula (10) in a method of simulating circuit characteristic degradation caused by hot carrier degradation of a MOS transistor.

$$\text{Age} = \int [(W^2 \cdot H)^{-1} \cdot I_{sub}^{m} \cdot I_d^{2-m}] dt \quad (12)$$

In extraction of hot carrier lifetime parameters, hot carrier lifetime parameters H and m are calculated as constants based on measured values in a stress acceleration experiment. Here, the model formula (12) of the present invention is distinguished from the conventional model formula (10) in that the model formula (12) adopts a functional form of (exponent of $I_d$ exponent)=2−(exponent of $I_{sub}$), while the conventional formula adopts (exponent of $I_d$)=1−(exponent of $I_{sub}$). The difference reflects the fact that a hot carrier lifetime is inversely proportional to a yield of one kind of hot carrier in a conventional technique, while the same lifetime is inversely proportional to a yield of two kinds of hot carriers in the present invention. The hot carrier lifetime parameters H and m are identical to those in a model formula (11) for a hot carrier lifetime. $V_{gd}$ dependence is considerably lowered, and thus, sufficient simulation accuracy can be obtained even if the parameters are applied as constants.

This model formula (11) is obtained in the following manner. This model formula (11) is derived from a lucky electron model (IEEE Electron Devices, vol. ED-32, pp. 375–385, February 1985) and a hypothesis composing a physical logic of the present invention, i.e., "hot carrier degradation occurs due to two kinds of hot carriers of an electron and a positive hole having energy of at least a critical energy required for generating damage to a MOS transistor, and the hot carrier lifetime is inversely proportional to a product of a yield of these two kinds of hot carriers".

For NMOS, $I_e$, $I_h$, and $I_{sub}$ are represented respectively by formulas (13), (14), and (15), in which $I_e$ is an electron yield having energy of at least a critical energy required for generating damage to a MOS transistor, $I_h$ is a yield of a positive hole having energy of at least a critical energy, and $I_{sub}$ is a substrate current.

$$I_e = I_d \exp(-\Phi_e/q\lambda_e E_m) \quad (13)$$

$$I_h = I_{sub} \exp(-\Phi_h/q\lambda_h E_m) \quad (14)$$

$$I_{sub} = I_d \exp(-\Phi_{ei}/q\lambda_e E_m) \quad (15)$$

Here, $I_d$ is a drain current, $I_{sub}$ is a substrate current, $\Phi_e$ is a critical energy of an electron required for generating damage, $\Phi_h$ is a critical energy of a positive hole required for generating damage, $\Phi_{ei}$ is a critical energy of an electron required for impact ionization, $\lambda_e$ is an electron mean free path, $\lambda_h$ is a mean free path of a positive hole, and $E_m$ is a maximum channel electric field strength. When a lifetime $\tau$ is hypothesized as being inversely proportional to a product of $I_e/W$ and $I_h/W$, and $qE_m$ is deleted by applying the formulas (13), (14) and (15), the following formula (16) is obtained. In this case, $I_e/W$ is a yield per unit gate width of an electron having energy of at least a critical energy, and $I_h/W$ is a yield of a positive hole having energy of at least a critical energy.

$$\tau \propto W^2/(I_e \cdot I_h) \qquad (16)$$
$$= W^2/(I_d \cdot I_{sub})\exp[(\Phi_h/\lambda_h + \Phi_e/\lambda_e)/qE_m]$$
$$= W^2/(I_d \cdot I_{sub})(I_{sub}/I_d)\wedge -$$
$$[(\Phi_h/\lambda_h + \Phi_e/\lambda_e)/(\Phi_{ei}/\lambda_e)]$$

As a result of replacement as shown in the following formula (17), $$m=(\Phi_h/\lambda_h+\Phi_e/\lambda_e)/(\Phi_{ei}/\lambda_e)+1 \qquad (17)$$

a formula (18) is obtained from the formula (16).

$$\tau (W/I_d)^2(I_{sub}/I_d)^{-m} \qquad (18)$$

When the parameter H is determined considering the formula (2), the model formula (11) representing a hot carrier lifetime of the present invention is obtained.

The way to derive the conventional formula (4) is described below in order to explain why the exponents of $I_d$ are different between the conventional model formula (4) and the model formula (11). The conventional model formula (4) depends on a hypothesis that hot carrier degradation occurs only due to an electron having energy of at least a critical energy required for generating damage to a MOS transistor, and that a hot carrier lifetime is inversely proportional to a yield of this hot carrier. When this hypothesis is adopted, a formula (19) corresponding to the formula (16) is obtained as follows.

$$\tau \propto W^2/I_e \qquad (19)$$
$$= W^2/I_d\exp(\Phi_e/q\lambda_h E_m)$$
$$= W^2/I_d(I_{sub}/I_d)\wedge -[(\Phi_e/\Phi_{ei})]$$

As a result of replacement as shown in the following formula (20), $$m=\Phi_e/\Phi_{ei} \qquad (20)$$

a formula (21) is obtained from the formula (19).

$$\tau W/I_d(I_{sub}/I_d)^{-m} \qquad (21)$$

As mentioned above, there is a difference in the exponents of $I_d$ between the model formula (18) of the present invention and the conventional model formula (21). A difference in formation of model formulas reflects the difference in the hypothesis about what the lifetime is inversely proportional to.

For PMOS, $I_e$, $I_h$, and $I_{sub}$ are represented respectively by formulas (22), (23), and (24), in which $I_e$ is an electron yield having energy of at least a critical energy required for generating damage to a MOS transistor, $I_h$ is a yield of a positive hole having energy of at least a critical energy, and $I_{sub}$ is a substrate current.

$$I_e=I_{sub}\exp(-\Phi_e/q\lambda_e E_m) \qquad (22)$$
$$I_h=I_d\exp(-\Phi_h/q\lambda_h E_m) \qquad (23)$$
$$I_{sub}=I_d\exp(-\Phi_{hi}/q\lambda_h E_m) \qquad (24)$$

Here, $I_d$ is a drain current, $I_{sub}$ is a substrate current, $\Phi_e$ is a critical energy of an electron required for generating damage, $\Phi_h$ is a critical energy of a positive hole required for generating damage, $\Phi_{hi}$ is a critical energy of a positive hole required for impact ionization, $\lambda_e$ is an electron mean free path, $\lambda_h$ is a mean free path of a positive hole, and $E_m$ is a maximum channel electric field strength. When a lifetime $\tau$ is hypothesized as being inversely proportional to a product of $I_e/W$ and $I_h/W$, and $qE_m$ is deleted by applying the formulas (22), (23) and (24), the following formula (25) is obtained. In this case, $I_e/W$ is a yield per unit gate width of an electron having energy of at least a critical energy, and $I_h/W$ is a yield of a positive hole having energy of at least a critical energy.

$$\tau \propto W^2/(I_e \cdot I_h) \qquad (25)$$
$$= W^2/(I_d \cdot I_{sub})\exp[(\Phi_h/\lambda_h + \Phi_e/\lambda_e)/qE_m]$$
$$= W^2/(I_d \cdot I_{sub})(I_{sub}/I_d)\wedge -$$
$$[(\Phi_h/\lambda_h + \Phi_e/\lambda_e)/(\Phi_{hi}/\lambda_h)]$$

When the above formula is rewritten as follows, $$m=(\Phi_h/\lambda_h+\Phi_e/\lambda_e)/(\Phi_{hi}/\lambda_h)+1 \qquad (26)$$

a formula (18) similar to that of NMOS is obtained from the formula (25). When the parameter H is determined considering the formula (2) as in the case of NMOS, the model formula (11) representing a hot carrier lifetime of the present invention is obtained.

The formula (12) for calculating Age, which is used in a method of simulating circuit characteristic degradation caused by hot carrier degradation of a MOS transistor of the present invention, is derived from a comparison with the formula (8) after parameters A and $\tau$ are deleted from the formulas (11) together with the formulas (1) and (2).

In the model formula (11) of the present invention, the gate-drain voltage $V_{gd}$ dependence of the hot carrier lifetime parameter is extremely small for N-type and P-type MOS transistors. Therefore, even if it is used as a constant, a lifetime can be estimated accurately in a wide range of voltage. As a result, in a method of estimating lifetime of hot carrier degradation of a MOS transistor of the present invention, a voltage condition for causing a maximum degradation rate and the lifetime, i.e., a lifetime in actual use, can .be estimated accurately from a measured value under a small number of stress voltage conditions and a drain current $I_d$ and a substrate current $I_{sub}$ in actual use. This serves to provide proper quality assurance of the product.

Since the hot carrier lifetime parameters H and m are constants in a method of simulating circuit characteristic degradation caused by hot carrier degradation of a MOS transistor according to the present invention, the hot carrier lifetime parameters H and m can be obtained from measured values taken under a small numbers of stress voltage conditions. For example, typically three conditions are used for a drain voltage, and one condition of a gate voltage $V_g$ causing a maximum substrate current $I_{sub}$ with respect to each drain voltage. In such a case, only about three conditions will be required for the stress voltage conditions. Since results of a DC stress experiment vary, plural numbers of (e.g., about three) transistors should be used for each voltage condition in order to obtain sufficient accuracy. Even so, only about nine transistors are required. In other words, the number of transistors can be decreased considerably from the numbers of 45 in a conventional technique. When about 9 transistors of the same process conditions are prepared for measurement under three voltage conditions, it will take only 2 days with ordinary equipment and staff. Therefore, a prompt feedback to the product designing can be provided. This enables extracting hot carrier lifetime parameters during a process development and to perform reliability simulation in order to provide product reliability at a time of designing. Therefore, it is not necessary to apply a process reliability evaluation standard having an excessive reliability margin for the purpose of quality assurance. In this way, the present invention can satisfy a reliability evaluation standard and also realize high transistor performance.

In the above-mentioned method of simulating reliability of a semiconductor device, the fitting parameter m can be a function of a gate-drain voltage, so that a simulation with higher accuracy can be performed.

Alternatively the fitting parameter m can be used as a function of the substrate voltage, so that a simulation with a high accuracy is obtainable even when the substrate voltage dependence of the hot carrier degradation is not negligible.

Furthermore in the above-mentioned method of simulating reliability of the semiconductor device, measurement data is plotted by using a logarithmic scale of a value $\tau \cdot (I_d/W)^2$ calculated from a lifetime $\tau$ in a DC stress experiment, a drain current $I_d$ during a stress, and a gate width W of the MOS transistor to enter a vertical axis and by using a logarithmic scale of a ratio $I_{sub}/I_d$ when $I_{sub}$ is a substrate current during stress and $I_d$ is a drain current, so that a fitting parameter m is obtained from a gradient of a line fitted with respect to the plot.

BRIEF DESCRIPTION OF THE DRAWINGS

FIG. 6 is an explanatory view to show a conventional method of estimating a lifetime.

FIGS. 7A and 7B are equivalent circuit diagrams to show a conventional method of simulating hot carrier degradation of a MOS transistor.

DETAILED DESCRIPTION OF THE INVENTION

Figure 1:
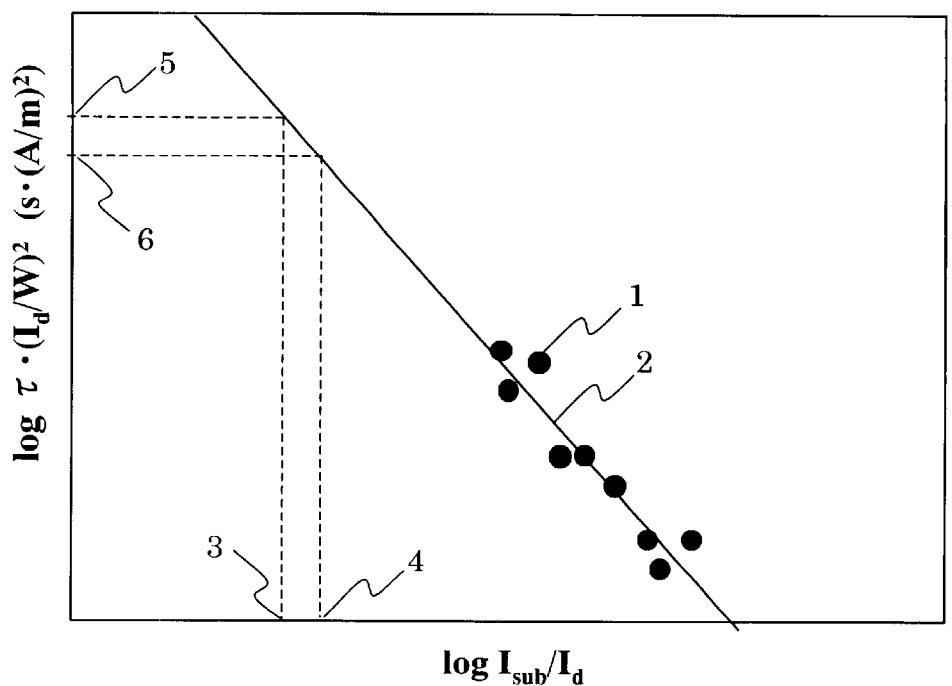
FIG. 1 is an explanatory view to show a method of estimating lifetime on the basis of a hot carrier lifetime model in an embodiment of the present invention.

Embodiments according to the present invention are further explained below by referring to the drawings.

FIG. 1 shows a method of estimating a lifetime based on a hot carrier lifetime model formula (11) according to the present invention. FIG. I is an explanatory view to show a method of extracting hot carrier lifetime parameters H and m in a hot carrier lifetime model of the present invention. In FIG. 1, the vertical axis is a logarithmic scale of a value $\tau \cdot (I_d/W)^2$ calculated from a lifetime $\tau$ in a DC stress experiment, a drain current $I_d$ during a stress, and a gate width W of a MOS transistor. The horizontal axis is a logarithmic scale of a ratio $I_{sub}/I_d$, where $I_{sub}$ is a substrate current during a stress and $I_d$ is a drain current. Black dots 1 denote data concerning plural measurement points in the DC stress experiment, and 2 denotes a line fitted with respect to the data concerning the measurement points. Numeral 3 denotes a value of $I_{sub}/I_d$ causing a maximum degradation, and 4 denotes a maximum value of $I_{sub}/I_d$ in actual use. Numeral 5 denotes a value on the fitting line with respect to the $I_{sub}/I_d$ value 3 causing maximum degradation, and 6 denotes a value on the fitting line with respect to the $I_{sub}/I_d$ maximum value 4 in actual use.

A method mentioned below is used to apply stress voltage for a stress acceleration experiment in a hot carrier reliability evaluation. A gate voltage $V_g$ used in the method is a voltage causing a maximum substrate current $I_{sub}$ with respect to plural drain voltages $V_d$ used in the acceleration experiment. At this time, one gate voltage is set for every drain voltage. Accordingly, a line 2 is obtained by fitting on the basis of a least squares method with respect to data 1 concerning plural measurement points. Based on the intercept and gradient of the line 2, hot carrier lifetime parameters H and m are obtained respectively as constants.

From these hot carrier lifetime parameters and the model formula (11), a value 3 of $I_{sub}/I_d$ causing maximum degradation and a value 5 on a fitting line at the $I_{sub}/I_d$ causing maximum degradation are obtained. The value 3 of $I_{sub}/I_d$ causing maximum degradation is smaller than a maximum value 4 of $I_{sub}/I_d$ in actual use. The value 5 on a fitting line at the $I_{sub}/I_d$ causing maximum hot carrier degradation is larger than a value 6 on the fitting line with respect to a maximum value of $I_{sub}/I_d$ in actual use.

Figure 2:
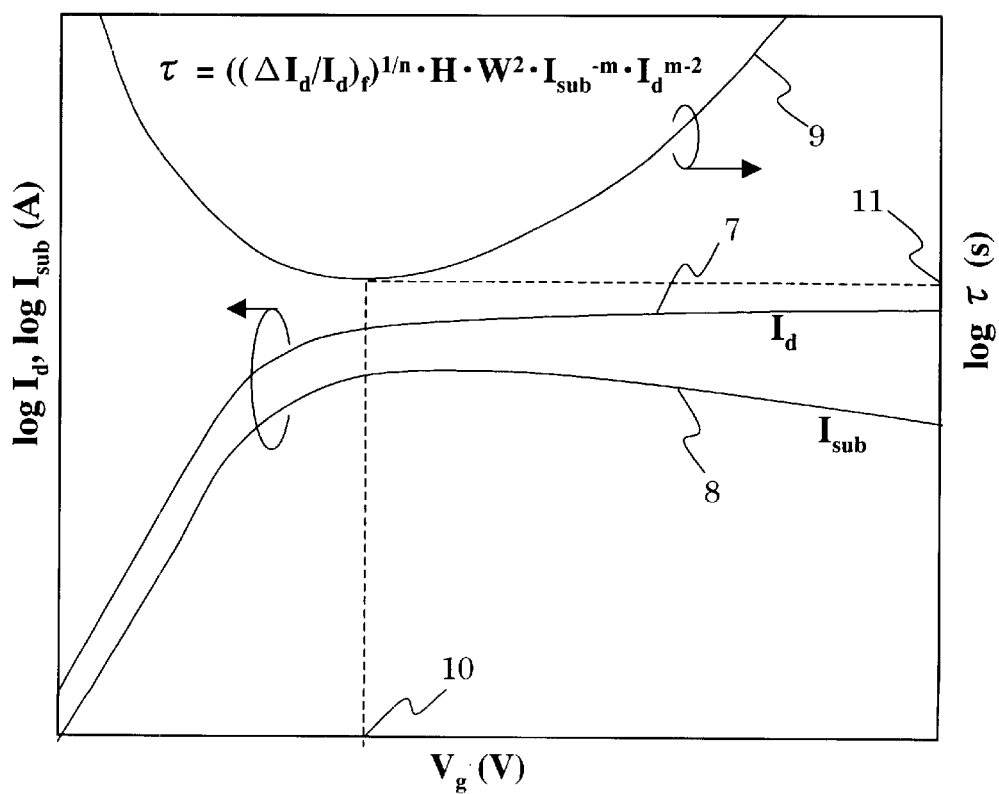
FIG. 2 is an explanatory view to show a method of calculating a hot carrier lifetime in actual use according to an embodiment of the present invention.

FIG. 2 shows a method to obtain a condition to cause maximum hot carrier degradation in actual use, and to obtain a hot carrier lifetime at that time. FIG. 2 is an explanatory view to show a method of calculating a lifetime in actual use depending on measurement values of transistor characteristics. In FIG. 2, the horizontal axis is a gate voltage, the left vertical axis is a logarithmic scale of a drain current and a substrate current, and the right vertical axis is a logarithmic scale of a lifetime. A curve 7 denotes a drain current $I_d$, a curve 8 denotes a substrate current $I_{sub}$, and a curve 9 denotes a calculation value of the lifetime. Numeral 10 denotes a gate voltage causing maximum hot carrier degradation, and 11 denotes an estimated value of lifetime in actual use. In this method, the gate voltage $V_g$ is changed under the maximum drain voltage $V_{ddmax}$ in actual use with respect to the transistor so as to measure the drain current 7 and the substrate current 8. The calculation value 9 is obtained from these measured values, the previously calculated hot carrier lifetime parameters H and m, and the model formula (11).

The gate voltage $V_g$ to cause the minimum calculation value of lifetime is the gate voltage 10 causing the maximum hot carrier degradation, and the lifetime is determined as the estimated value 11 of lifetime in actual use. In this way, the condition to cause the maximum hot carrier degradation in actual use is obtained so as to obtain the hot carrier lifetime at that time. By using this for the estimated lifetime in actual use, a hot carrier lifetime under a condition to cause the maximum hot carrier degradation can be obtained.

Figure 3:
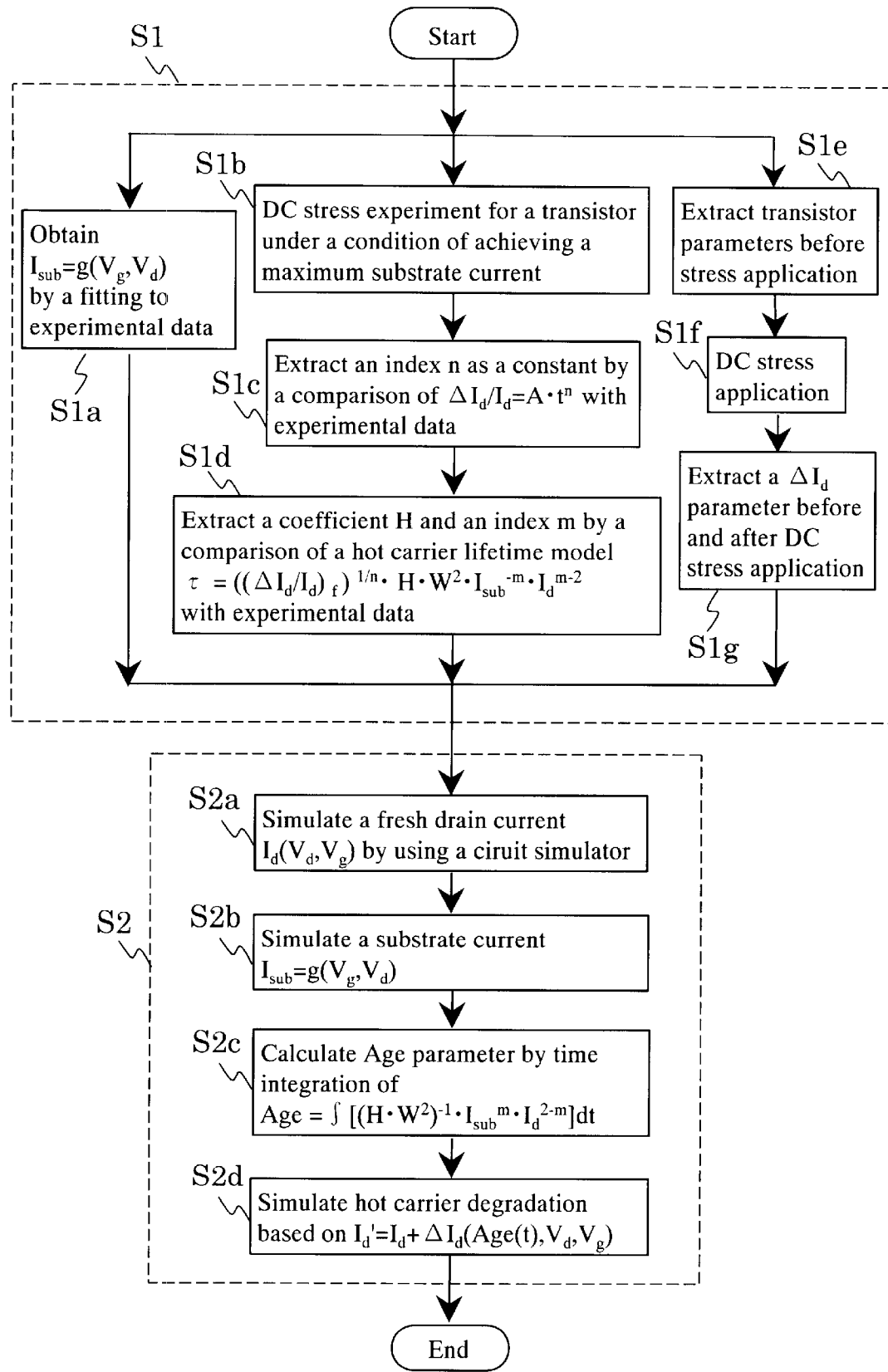
FIG. 3 is a flow chart to show a method of simulating circuit characteristic degradation in an embodiment of the present invention.

FIG. 3 is a flow chart showing a method process of simulating circuit characteristic degradation according to the present invention. In the flow chart, a step S1 includes sub-steps S1a-S1g to extract unknown parameters in the formulas (9) and (12) by using a preliminary measuring experiment.

In the sub-step S1a, in order to determine a substrate current $I_{sub}$ in the formula (10), a model formula $I_{sub}=g(V_g, V_d)$ is determined to fit with a plurality of substrate current $I_{sub}$ measurement data in the preliminary measuring experiment. Here, $V_g$ represents a gate voltage, and $V_d$ represents a drain voltage. A method of determining a substrate current $I_{sub}$ is described in IEEE Electron Device Lett., vol. EDL-5, pp.505–507, December 1984 by Chan et al.

The sub-steps S1b-S1d serve to extract hot carrier lifetime parameters by a preliminary measuring experiment. In the sub-step S1b, stress voltage is applied to a MOS transistor in order to measure a hot carrier lifetime defined in the formula (2). For applying the stress voltage, a gate voltages $V_g$ causing a maximum substrate current $I_{sub}$ is used with respect to plural drain voltage $V_d$. At this time, one gate voltage is set for every drain voltage. In the subsequent sub-step S1c, a coefficient n is extracted as a constant by a comparison between the empirical formula (1) and data concerning plural measurement points in a DC stress experiment in the sub-step S1b. Similarly in the sub-step S1d, an index m and a coefficient H are extracted as constants by a comparison between the empirical formula (11) and data concerning plural measurement points in a DC stress experiment of the sub-step S1b.

The sub-steps S1e-S1g serve to determine a fresh drain current $I_d$ before applying stress and drain current degradation $\Delta I_d$ in the formula (9) for a $\Delta I_d$ model. In the sub-step S1e, transistor parameters, such as a flat band voltage and carrier mobility to determine fresh drain current $I_d(V_d, V_g)$ before stress application, are extracted. BSIM (Berkeley Short-Channel IGFET Model) can be used for a model to determine such a fresh drain current $I_d(V_d, V_g)$. Details of the BSIM method are described in IEEE J. Solid-State Circuits, vol. SC-22, pp. 558–566, August 1987 by Sheu et al. In the subsequent sub-step S1f, a DC stress is applied to the transistor. In the sub-step S1g, $\Delta I_d$ model parameters before and after DC stress application are extracted. The drain current degradation $\Delta I_d(\text{Age}, V_d, V_g)$ is determined from this $\Delta I_d$ model parameter. The $\Delta I_d$ model concerning NMOS is described by the above-mentioned Quader et al. PMOS is described in JP-A-08-64814.

Transistor parameters should be extracted before the DC stress application in order to bring actual transistor characteristics before the stress application to coincide with the simulated transistor characteristics. Similarly, the $\Delta I_d$ model parameters should be extracted before and after the DC stress application in order to bring actual drain current degradation $\Delta I_d$ after the stress application to coincide with the simulated drain current degradation $\Delta I_d$.

A step S2 includes sub-steps S2a-S2d in which a reliability simulator simulates hot carrier degradation of a transistor in accordance with the parameters extracted in the step S1 and the formulas (9) and (12).

In the sub-step S2a, a drain current is simulated by the transistor parameters before stress application, and the parameters have been extracted in the sub-step S1e. In the sub-step S2b, a substrate current is simulated by the substrate current model formula $I_{sub}=g(V_g, V_d)$ determined by the S1a. In the sub-step S2c, Age, which represents degradation of every transistor on the basis of the formula (12), is calculated by time integration of a function of a drain current $I_d$ and substrate current $I_{sub}$ in a circuit. At this time, a drain current $I_d$ simulated in the sub-step S2a, a substrate current $I_{sub}$ simulated in the sub-step S2b, and hot carrier lifetime parameters H and m calculated in the sub-step S1d, are used. In the sub-step S2d, hot carrier degradation of the transistor is simulated based on the Age, by using the formula (9).

Figure 4:
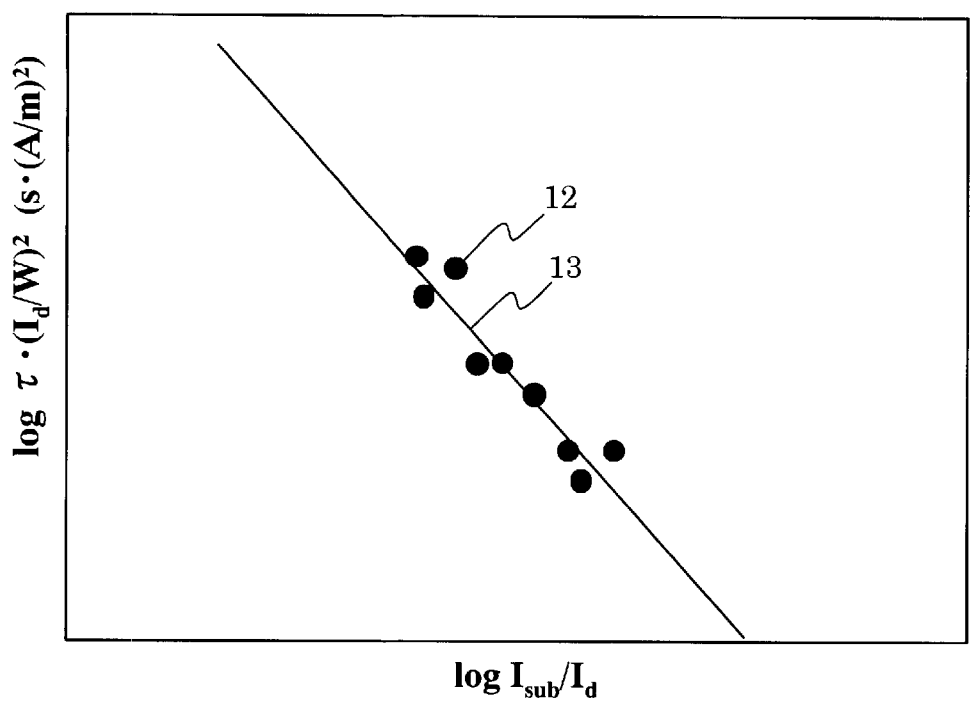
FIG. 4 is an explanatory view to show a method of extracting a hot carrier lifetime parameter as a constant in an embodiment of the present invention.

The following is a detail about a method of extracting the hot carrier lifetime parameters H and m on the basis of a hot carrier lifetime model. FIG. 4 is an explanatory view to show a method of extracting hot carrier lifetime parameters H and m as constants. FIG. 4 shows a plot to calculate the hot carrier lifetime parameters H and m included in the empirical formula (11) using a hot carrier lifetime model. In FIG. 4, the vertical axis is a logarithmic scale of a value $\tau \cdot (I_d/W)^2$ calculated from a lifetime $\tau$ in a DC stress experiment, a drain current $I_d$ during a stress, and a gate width W of a MOS transistor. The horizontal axis is a logarithmic scale of a ratio $I_{sub}/I_d$ where $I_{sub}$ is a substrate current during a stress and $I_d$ is a drain current. Numeral 12 denotes data concerning plural measurement points in a DC stress experiment, and 13 denotes a line fitted with respect to the data 12 concerning the measurement points.

For measuring a lifetime $\tau$ of a MOS transistor, for example, three kinds of drain voltage conditions, and a gate voltage $V_g$ condition causing a maximum substrate current $I_{sub}$ with respect to each drain voltage are prepared, and three transistors are measured under each voltage condition. Accordingly, the data 12 concerning nine measurement points are obtained. A line 13 is obtained by performing a fitting on the basis of a least squares method with respect to the data 12 for the nine measurement points. The fitted line 13 has a gradient of –m. From an intercept and the gradient of the line 13, hot carrier lifetime parameters H and m in the model formula (11) of the present invention can be obtained respectively as constants. Since the hot carrier lifetime parameters are constants, the measurement values in the model of the present invention can be decreased to nine, while a conventional model requires as many as 45 measurement values. As a result, the model of the present invention takes only about two days for extracting hot carrier lifetime parameters with ordinary equipment and staff, while a conventional model takes about 10 days with the same equipment and staff. In this manner, the present invention can shorten the extraction period considerably.

In the calculation to obtain hot carrier lifetime parameters according to the present invention, accuracy of the extracted parameters can be improved by applying the vertical axis to $\tau \cdot (I_d/W)^2$. For example, using $\tau \cdot (I_d/W) \cdot (I_{sub}/W)$ to enter the vertical axis is equivalent mathematically or physically. In this case, the gradient of the fitted line is $-(m-1)$. However in this method, $I_{sub}$ is included both in the horizontal axis and vertical axis. This increases variations in data concerning the measurement points to be plotted, and accuracy of the extracted hot carrier lifetime parameters degrades. Therefore, using $\tau \cdot (I_d/W)^2$ to enter the vertical axis is effective to extract hot carrier lifetime parameters with a high accuracy as indicated in the present invention.

In general, hot carrier lifetime parameters H and m can be provided with sufficient accuracy for use by extracting parameters as constants and by calculating Age. When a further accurate simulation is required, the hot carrier lifetime parameters H and m of the model formula (11) are extracted as functions of gate-drain voltage $V_{gd}$, and in addition to that, Age of the model formula (12) can be calculated as a function of the gate-drain voltage $V_{gd}$ at a time of simulating circuit characteristic degradation. In such a case, a stress voltage is applied by setting a gate voltage $V_g$ so that the gate-drain voltage $V_{gd}=V_g-V_d$ becomes constant with respect to plural drain voltages $V_d$ in the sub-step S1$b$ shown in the flow chart of FIG. 3 to indicate a method process of simulating circuit characteristic degradation according to the present invention. Generally in this method, plural $V_{gd}$ are set and a gate voltage $V_g=V_d+V_{gd}$ corresponding to the preliminarily set plural $V_{gd}$ with respect to the every drain voltage $V_d$ are also set. In the sub-step S1$d$, an index m and a coefficient H are extracted as functions of $V_{gd}$ by a comparison between the model formula (11) and the data concerning plural measurement points in the DC stress experiments of the sub-step S1$b$. In the sub-step S2$c$, Age that represents degradation of each transistor is calculated based on the formula (12) by using the index m and coefficient H as functions of $V_{gd}$.

Figure 5:
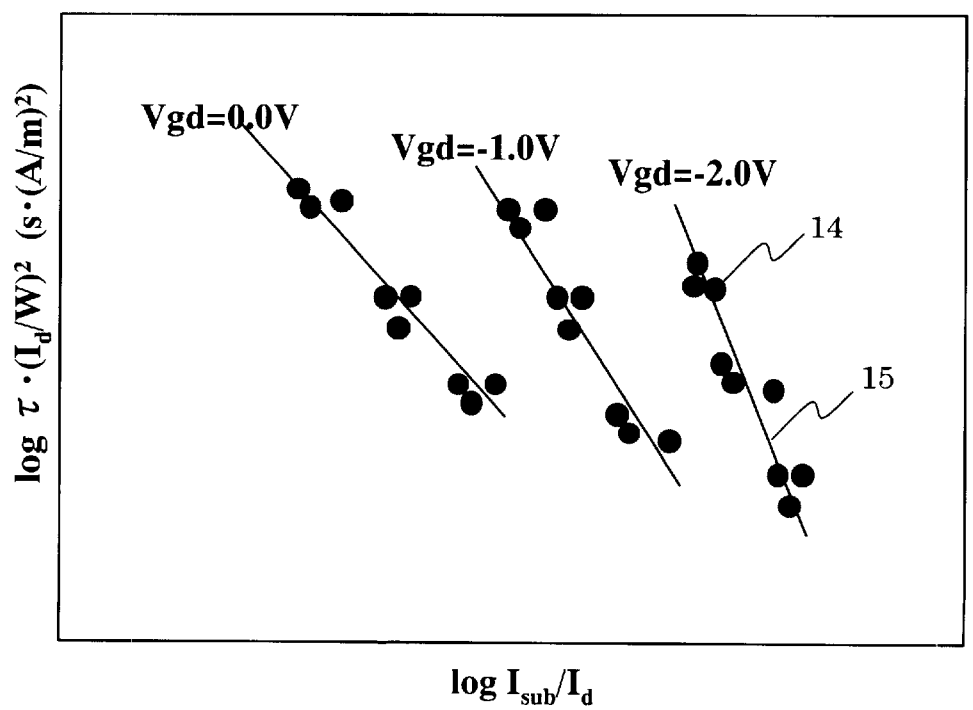
FIG. 5 is an explanatory view to show a method of extracting a hot carrier lifetime parameter as a function of a gate-drain voltage in an embodiment of the present invention.
Figure 8:
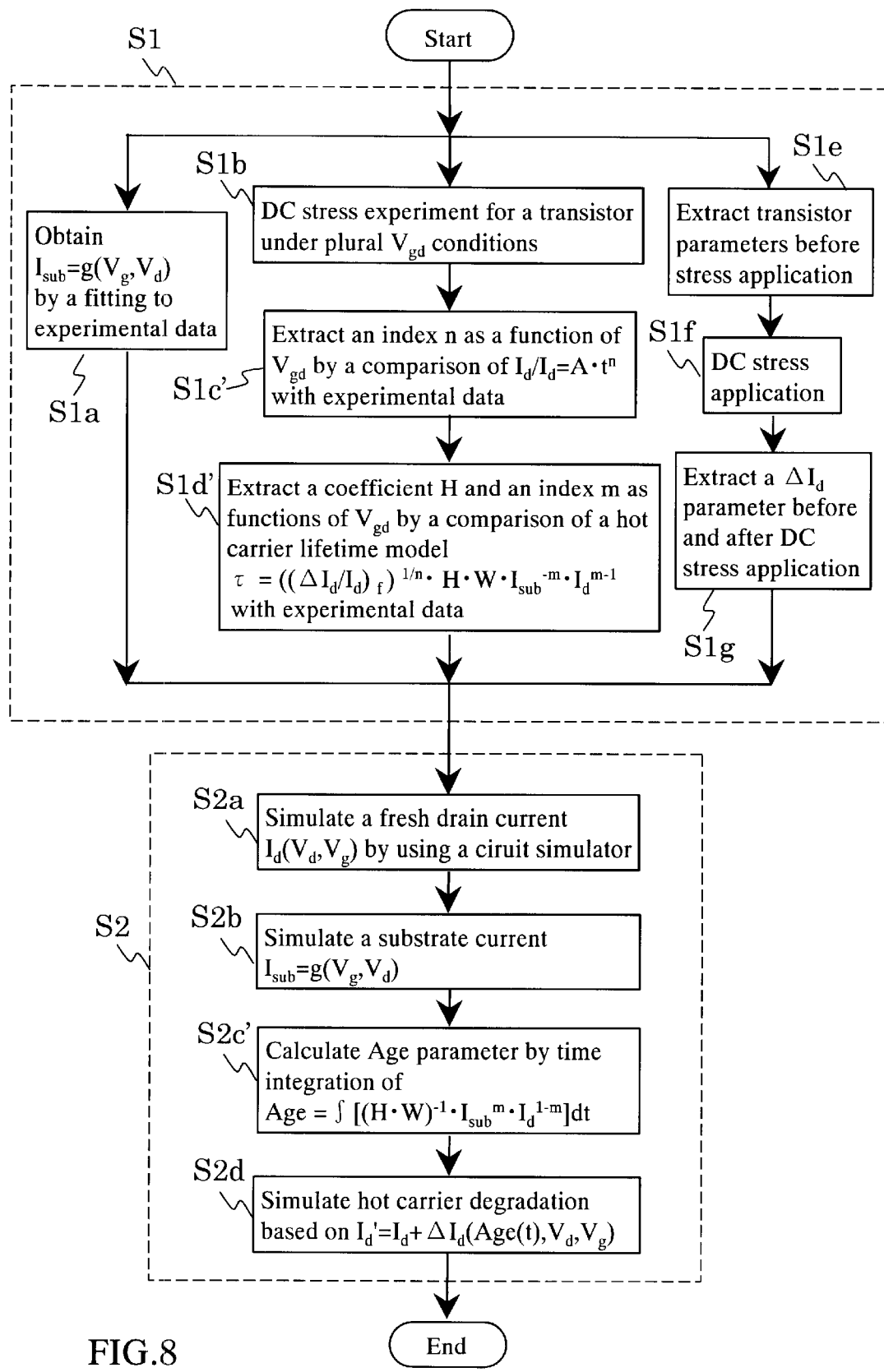
FIG. 8 is a flow chart to show a conventional method process of simulating hot carrier degradation of a MOS transistor.
Figure 9:
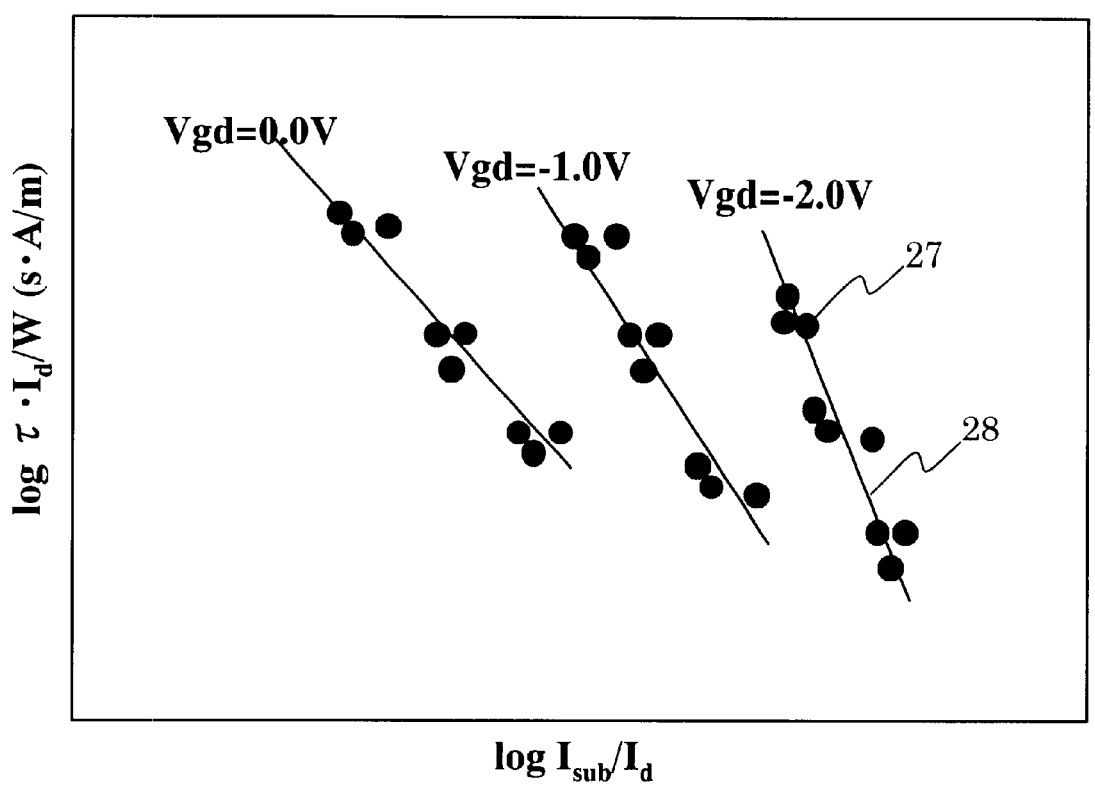
FIG. 9 is an explanatory view to show a conventional method of extracting a hot carrier lifetime parameter.

The following explanation is about a method of extracting hot carrier lifetime parameters H and m as functions of a gate-drain voltage $V_{gd}$ in a hot carrier lifetime model according to the present invention. FIG. 5 is an explanatory view to show a method of extracting hot carrier lifetime parameters H and m as functions of a gate-drain voltage in a hot carrier lifetime model according to the present invention. FIG. 5 indicates a plot to calculate the hot carrier lifetime parameters H and m included in the empirical formula (11) using a hot carrier lifetime model. In FIG. 5, the vertical axis is a logarithmic scale of a value $\tau \cdot (I_d/W)^2$ calculated on the basis of a lifetime $\tau$ in a DC stress experiment, a drain current $I_d$ during a stress, and a gate width W of a MOS transistor. The horizontal axis is a logarithmic scale of a ratio $I_{sub}/I_d$ where $I_{sub}$ is a substrate current during the stress, and $I_d$ is a drain current. Numeral 14 denotes data concerning plural measurement points in a DC stress experiment, and 15 denotes a line fitted with respect to the data 14 concerning the measurement points.

The lifetime $\tau$ of the MOS transistor is measured under plural conditions of gate-drain voltages $V_{gd}$, for example, three conditions of $V_{gd}$=0.0, −1.0, and −2.0V, so that data 14 concerning plural measurement points are obtained. A line 15 is obtained by performing a fitting on the basis of a least squares method with respect to the data 14 for the plural measurement points. From the intercept and the gradient of the line 15, hot carrier lifetime parameters H and m can be obtained respectively. Similarly, hot carrier lifetime parameters H and m can be obtained as functions of plural $V_{gd}$ in a hot carrier lifetime model.

When a substrate voltage dependence of the hot carrier degradation is not negligible, hot carrier lifetime parameters H and m in the model formula (11) are extracted as functions of the substrate voltage $V_b$, while Age in the model formula (12) can be calculated as a function of the substrate voltage $V_b$ at a time of simulating circuit characteristic degradation. In such a case, stress voltage is applied by setting plural $V_b$ with respect to plural drain voltages $V_d$ in the sub-step S1$b$ shown in the flow chart of FIG. 3 to indicate a method process of simulating circuit characteristic degradation according to the present invention. In the sub-step S1$d$, an index m and a coefficient H are extracted as functions of $V_b$ by a comparison between the model formula (11) and the data concerning plural measurement points in the DC stress experiment of the sub-step S1$b$. In the sub-step S2$c$, Age that represents degradation of each transistor is calculated based on the formula (12) by using the index m and coefficient H as functions of $V_b$.

In a MOS transistor, plural degradation modes can exist depending on stress voltages or stress temperatures. In such a case, drain current $I_d$″ after degradation is simulated in accordance with a formula (12) including one or plural Age′ corresponding to other degradation modes, in place of a drain current $I_d$′ after degradation represented by a model formula (9) of the present invention.

$$I_d''=I_d(V_d, V_g)+\Delta I_d(\text{Age}, \text{Age}', V_d, V_g) \tag{9}$$

In the methods of estimating a lifetime or simulating circuit characteristic degradation in the embodiment of the present invention, the processes are programmed wholly or partly, and performed automatically by computers. Alternatively, the methods can be performed manually when automatic performance is not available.

As mentioned above, a lifetime in actual use can be estimated accurately according to the method of estimating lifetime of hot carrier degradation of a MOS transistor in the present invention, and thus, quality assurance of the product can be provided properly. As a result, the reliability of products on the market will be improved.

In the method of simulating reliability according to the present invention, an experiment to obtain hot carrier lifetime parameters can be carried out with small numbers of transistors, and thus, prompt feedback to product designing will be available. Reliability simulation can be performed by extracting hot carrier lifetime parameters during a process development, so that the product reliability can be provided at the time of designing. Accordingly, products having high performance and high reliability can be developed in a short period and produced on a large scale.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A method of estimating a lifetime of a semiconductor device, comprising estimating a hot carrier lifetime of a NMOS transistor depending on a hot carrier lifetime model expressed by $$\tau I_{sub}^{-m} \cdot I_d^{m-2}$$

where $\tau$ is a lifetime, $I_{sub}$ is a substrate current, $I_d$ is a drain current, and m is a fitting parameter, the fitting parameter m being defined as the following formula $$m=(\Phi_h/\lambda_h+\Phi_e/\lambda_e)/(\Phi_{ei}/\lambda_e)+1$$

where $\Phi_h$ is a critical energy of a positive hole required for generating damage, $\Phi_e$ is a critical energy of an electron required for generating damage, $\Phi_{ei}$ is a critical energy of an electron required for impact ionization, $\lambda_h$ is a mean free path of a positive hole, and $\lambda_e$ is an electron mean free path.

2. The method of estimating a lifetime of a semiconductor device according to claim 1, wherein a minimum value of the hot carrier lifetime in actual use is estimated from a substrate current and a drain current under a use condition.

3. A method of simulating reliability of a semiconductor device, comprising calculating a parameter Age representing cumulative stress quantity with respect to a NMOS transistor depending on a model formula for simulating hot carrier degradation of the NMOS transistor:

$$\text{Age} \int [I_{sub}{}^m \cdot I_d{}^{2-m}] dt$$

Where t is a time, $I_{sub}$ is a substrate current, $I_d$ is a drain current, and m is a fitting parameter, the fitting parameter m being defined as the following formula $$m = (\Phi_h/\lambda_h + \Phi_e/\lambda_e)/(\Phi_{ei}/\lambda_e) + 1$$

where $\Phi_h$ is a critical energy of a positive hole required for generating damage, $\Phi_e$ is a critical energy of an electron required for generating damage, $\Phi_{ei}$ is a critical energy of an electron required for impact ionization, $\lambda_h$ is a mean free path of a positive hole, and $\lambda_e$ is an electron mean free path.

4. The method of simulating reliability of a semiconductor device according to claim 3, wherein the fitting parameter m is a function of a gate-drain voltage.

5. The method of simulating reliability of a semiconductor device according to claim 3, wherein the fitting parameter m is a function of a substrate voltage.

6. The method of simulating reliability of a semiconductor device according to claim 3, wherein measurement data is plotted in a graph where an vertical axis is a logarithmic scale of a value $\tau \cdot (I_d/W)^2$ calculated on the basis of a lifetime $\tau$ in a DC stress experiment, a drain current $I_d$ during a stress, and a gate width W of the NMOS transistor, while a horizontal axis is a logarithmic scale of a ratio $I_{sub}/I_d$ in which $I_{sub}$ is a substrate current during the stress and $I_d$ is a drain current, and the fitting parameter m is obtained on the basis of a gradient of a line fitted with respect to the plot.

7. A method of estimating a lifetime of a semiconductor device, comprising estimating a hot carrier lifetime of a PMOS transistor depending on a hot carrier lifetime model expressed by $$\tau I_{sub}{}^{-m} \cdot I_d{}^{m-2}$$

where $\tau$ is a lifetime, $I_{sub}$ is a substrate current $I_d$ is a drain current, and m is a fitting parameter, the fitting parameter m being defined as a following formula $$m = (\Phi_h/\lambda_h + \Phi_e/\lambda_e)/(\Phi_{hi}/\lambda_h) + 1$$

where $\Phi_h$ is a critical energy of a positive hole required for generating damage, $\Phi_e$ is a critical energy of an electron required for generating damage, $\Phi_{hi}$ is a critical energy of a positive hole required for impact ionization, $\lambda_h$ is a mean free path of a positive hole, and $\lambda_e$ is an electron mean free path.

8. The method of estimating a lifetime of a semiconductor device according to claim 7, wherein a minimum value of the hot carrier lifetime in actual use is estimated from a substrate current and a drain current under a use condition.

9. A method of simulating reliability of a semiconductor device, comprising calculating a parameter Age representing cumulative stress quantity with respect to a PMOS transistor depending on a model formula for simulating hot carrier degradation of the PMOS transistor:

$$\text{Age} \int [I_{sub}{}^m \cdot I_d{}^{2-m}] dt$$

Where t is a time, $I_{sub}$ is a substrate current $I_d$ is a drain current, and m is a fitting parameter, the fitting parameter m being defined as the following formula $$m = (\Phi_h/\lambda_h + \Phi_e/\lambda_e)/(\Phi_{hi}/\lambda_h) + 1$$

where $\Phi_h$ is a critical energy of a positive hole required for generating damage, $\Phi_e$ is a critical energy of an electron required for generating damage, $\Phi_{hi}$ is a critical energy of a positive hole required for impact ionization, $\lambda_h$ is a mean free path of a positive hole, and $\lambda_e$ is an electron mean free path.

10. The method of simulating reliability of a semiconductor device according to claim 9, wherein the fitting parameter m is a function of a gate-drain voltage.

11. The method of simulating reliability of a semiconductor device according to claim 9, wherein the fitting parameter m is a function of a substrate voltage.

12. The method of simulating reliability of a semiconductor device according to claim 9, wherein measurement data is plotted in a graph where an vertical axis is a logarithmic scale of a value $\tau(I_d/W)^2$ calculated on the basis of a lifetime $\tau$ in a DC stress experiment, a drain current $I_d$ during a stress, and a gate width W of the PMOS transistor, while a horizontal axis is a logarithmic scale of a ratio $I_{sub}/I_d$ in which $I_{sub}$ is a substrate current during the stress and $I_d$ is a drain current, and the fitting parameter m is obtained on the basis of a gradient of a line fitted with respect to the plot.

* * * * *